United States Patent [19]
Hu et al.

[11] Patent Number: 5,718,967
[45] Date of Patent: Feb. 17, 1998

[54] COATED PLASTIC SUBSTRATE

[75] Inventors: Ing-Feng Hu; Paul J. O'Connor; James C. Tou; James H. Sedon; Stephen E. Bales; Donald J. Perettie, all of Midland, Mich.

[73] Assignee: The Dow Chemical Company, Midland, Mich.

[21] Appl. No.: 729,101

[22] Filed: Oct. 11, 1996

Related U.S. Application Data

[60] Provisional application No. 60/005,153 Oct. 13, 1995.
[51] Int. Cl.$^6$ .............................. B32B 7/02; B32B 27/36
[52] U.S. Cl. .............................. 428/216; 427/489; 427/579; 428/215; 428/412; 428/447; 428/448
[58] Field of Search .............................. 428/212, 213, 428/214, 215, 216, 412, 447, 448; 427/488, 489, 492, 493, 495, 579

[56] References Cited

U.S. PATENT DOCUMENTS

| | | | |
|---|---|---|---|
| 4,830,873 | 5/1989 | Benz et al. | 427/489 |
| 5,237,439 | 8/1993 | Misono et al. | 359/74 |
| 5,298,587 | 3/1994 | Hu et al. | 528/10 |
| 5,313,322 | 5/1994 | Takanashi et al. | 359/82 |
| 5,320,875 | 6/1994 | Hu et al. | 427/493 |
| 5,354,497 | 10/1994 | Fukuchi et al. | 252/299.01 |

FOREIGN PATENT DOCUMENTS

| | | |
|---|---|---|
| 5-88202 | 4/1993 | Japan. |
| 6-99536 | 4/1994 | Japan. |
| 6-145317 | 5/1994 | Japan. |
| 7-52270 | 2/1995 | Japan. |
| 7-52271 | 2/1995 | Japan. |
| 95/17437 | 6/1995 | WIPO. |

*Primary Examiner*—D. S. Nakarani
*Attorney, Agent, or Firm*—Reid S. Willis

[57] ABSTRACT

The present invention is a laminate which comprises:
a) a plastic substrate having a surface;
b) an adhesion promoter layer which is a first plasma polymerized organosilicon compound deposited on the surface of the substrate in the substantial absence of oxygen; and
c) a protective coating layer which is a second plasma polymerized organosilicon compound deposited on the surface of the adhesion layer at a power density from about $10^6$ J/kg to about $10^8$ J/kg, and in the presence of a sufficient stoichiometric excess of oxygen to form a silicon polymer of $SiO_{1.8-2.4}$ $C_{0.3-1.0}$ and $H_{0.7-4.0}$.

The coating layer provides abrasion and solvent resistance for the substrate, and the adhesion promoter prevents the coating layer from peeling off the substrate. The coated plastic substrate can be used in liquid crystal display devices as an alternative to glass.

12 Claims, 1 Drawing Sheet

SOC and Tg vs. Composition, BHPF/BA Copolycarbonates

COATED PLASTIC SUBSTRATE

CROSS REFERENCE TO RELATED APPLICATION

This application claims the benefit of U.S. Provisional application Ser. No. 60/005,153, filed Oct. 13, 1995.

BACKGROUND OF THE INVENTION

The present invention is a coated plastic substrate, one embodiment of which may be useful in a liquid crystal display device. The coating protects the substrate against abrasion and solvent degradation.

Presently, there is a need for thinner, lighter weight liquid crystal displays with improved ruggedness. This need is manifested by the fact that an expensive portable device suffers catastrophic failure from the breakage of 10 cents worth of glass. Moreover, over half of all field failures from some devices are due to such breakage. Because of their superior flexibility and impact resistance, plastic substrates offer an alternative to glass for use as substrates in liquid crystal display devices (LCDs). Plastic substrates may also offer an economical advantage over glass substrates through improved yields in the manufacturing process.

The advantages inherent in glass substrates cannot be sacrificed for improved ruggedness, however. If plastics are going to be the substrate of choice, it is desirable that they be designed to have certain physical properties, including a) optical clarity; b) stability at temperatures required to process the display, typically at least 160° C.; c) low birefringence; d) resistance to the chemicals used in display production; e) light stability; f) scratch resistance; g) hardness; and h) electrical resistivity.

Accordingly, it would be desirable to discover an alternative to glass for LCDs and other uses that overcomes the aforementioned deficiencies of glass substrates.

SUMMARY OF THE INVENTION

Figure 1:
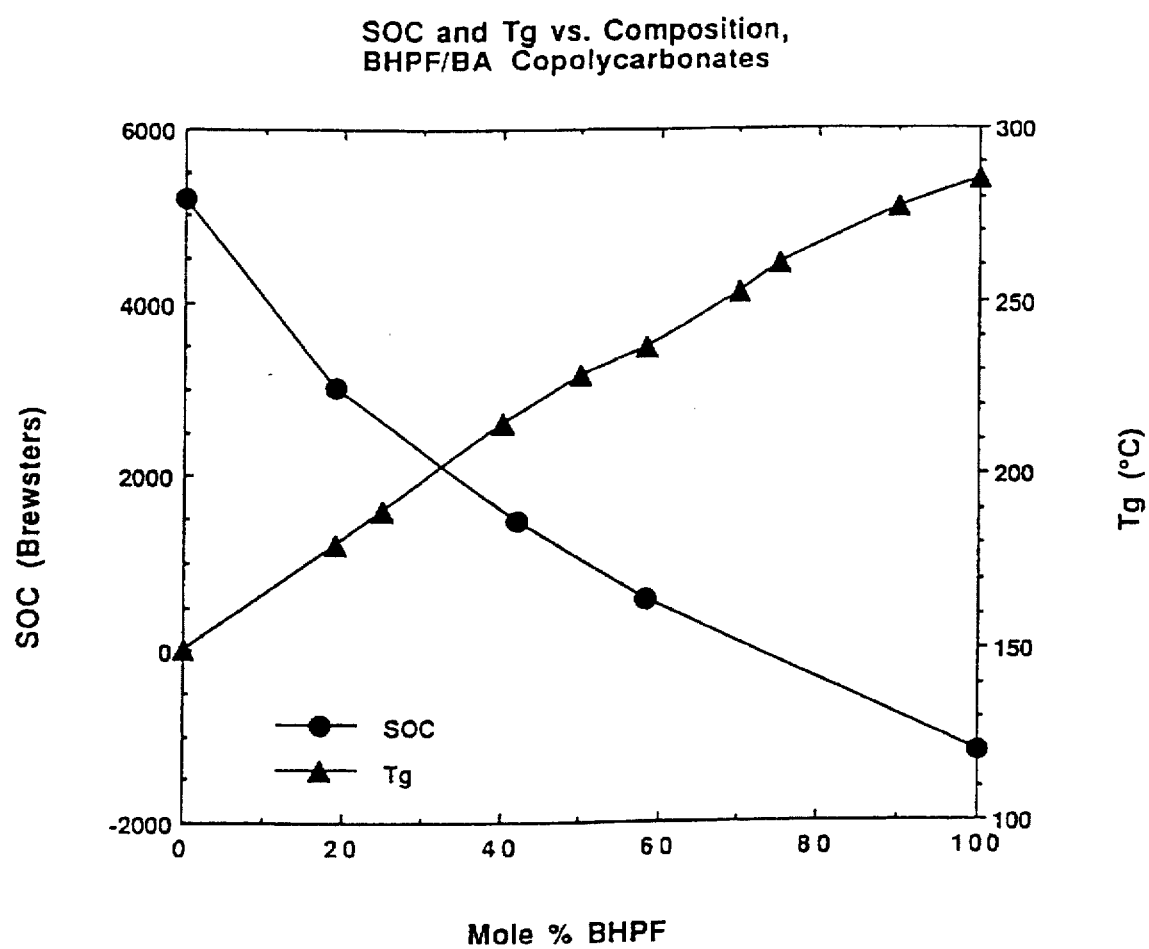
FIG. 1 is a graph of stress optic coefficient (SOC) and glass transition temperature ($T_g$) Of copolycarbonates of 9,9-bis(4-hydroxyphenyl)fluorene and bisphenol A.

In a first aspect, the present invention is a laminate which comprises:

a) a plastic substrate having a surface;

b) an adhesion promoter layer which is a first plasma polymerized organosilicon compound deposited on the surface of the substrate at a power level sufficient to create an interfacial chemical reaction for adhesion and in the substantial absence of oxygen; and c) a protective coating layer which is a second plasma polymerized organosilicon compound deposited on the surface of the adhesion layer at a power density from about $10^6$ J/kg to about $10^8$ J/kg, and in the presence of a higher level of oxygen than in step (b).

In a second aspect, the present invention is a laminate which comprises:

a) a plastic substrate having a surface and a thickness of about 0.1 mm to about 10 mm;

b) an adhesion promoter layer which is a plasma polymerized tetramethyldisiloxane deposited on the surface of the substrate in the substantial absence of oxygen, which adhesion promoter has a thickness of about 1000 Å to about 2000 Å;

c) a protective coating layer which is a plasma polymerized tetramethyldisiloxane deposited on the surface of the adhesion promoter layer at a power density from about $10^6$ J/kg to about 10J/kg, and in the presence of a sufficient stoichiometric excess of oxygen to form an organosilicon compound having the formula $SiO_{1.8-2.4}$ $C_{0.3-1.0}$ and $H_{0.7-4.0}$ that contains trapped water and at least one of the following functional groups: —Si—O—Si—, —Si—CH$_2$—, —Si—H, or—Si—OH;

wherein the thickness of the protective coating layer is not less than about 0.1 micron and not greater than about 2 microns; and d) an $SiO_x$ layer which is a layer of a plasma polymerized tetramethyldisiloxane deposited on the surface of the protective coating layer, in the presence of a stoichiometric excess of oxygen, and at a power density of at least four times the power density used to form the protective coating layer, wherein the $SiO_x$ layer has a thickness of not less than about 0.1 micron and not more than about 1 micron.

The laminate of the present invention is resistant to abrasion and solvent by virtue of the presence of the layered coatings. Furthermore, the coatings are resistant to peeling by virtue of the presence of the adhesion promoter layer.

DETAILED DESCRIPTION OF THE INVENTION

The substrate used for the laminate of the present invention can be a thermoplastic or thermoset material. Examples of suitable thermoplastic materials include polyethylene, polypropylene, polystyrene, polyvinylacetate, polyvinylalcohol, polyvinylacetal, polymethacrylate ester, polyacrylic acids, polyether, polyester, polycarbonate, cellulous resin, polyacrylonitrile, polyamide, polyimide, polyvinylchloride, fluorine containing resins, and polysulfone. Examples of thermosets are epoxy and urea melamine.

The thickness of the substrate is application dependent, but is preferably not less than about 0.1 mm, more preferably not less than about 0.3 mm, and most preferably not less than about 0.5 mm, and preferably not more than about 10 mm, more preferably not more than about 5 mm, and most preferably not more than about 2 mm.

The surface of the substrate is coated first with an adhesion promoter layer, which is formed from the plasma polymerization of an organosilicon compound deposited on the surface of the substrate. The plasma polymerization of the organosilicon compound to produce the adhesion promoter layer is carried out at a sufficient power level to create an interfacial chemical reaction for adhesion, preferably at a power level from about $5 \times 10^7$ J/kg to about $5 \times 10^9$ J/kg. The adhesion promoter layer is prepared in the absence or substantial absence of a carrier gas such as oxygen. The term "substantial absence of oxygen" is used herein to mean that the amount of oxygen present in the plasma polymerization process is insufficient to oxidize all the silicon and carbon in the organosilicon compound. Similarly, the term "stoichiometric excess of oxygen" is used herein to mean that the total moles of oxygen present is greater than the total moles of the silicon and carbon in the organosilicon compound.

The thickness of the adhesion promoter layer is application dependent and is preferably not less than about 50 Å, more preferably not less than about 500 Å, and most preferably not less than about 1000 Å, and preferably not more than about 10,000 Å, more preferably not more than about 5000 Å, and most preferably not more than about 2000 Å.

The adhesion promoter layer is then coated with a protective coating layer which is a plasma polymerized organosilicon compound deposited on the surface of the adhesion promoter layer at a power density from about $10^6$ J/kg to about $10^8$ J/kg, and in the presence of a higher level of oxygen than used to form the adhesion promoter layer. Preferably, the protective coating layer is formed in the presence of a stoichiometric excess of oxygen.

The thickness of the protective coating for the substrate depends primarily on the properties of the coating as well as the substrate, but in general, is sufficiently thick to impart solvent resistance to the substrate. Preferably, the coating thickness is not less than about 0.1, more preferably not less than about 0.4, and most preferably not less than about 0.8 micron, and not greater than about 10, more preferably not greater than about 5, and most preferably not greater than about 2 microns.

The laminate may optionally comprise an $SiO_x$ layer which is a plasma polymerized organosilicon compound deposited on the surface of the layer of the protective coating layer, in the presence of a stoichiometric excess of oxygen, and at a power density of at least about twice, more preferably at least about 4 times, and most preferably at least about 6 times the power density used to form the protective coating layer. This layer is conveniently referred to as an $SiO_x$ layer. However, the $SiO_x$ layer may also contain hydrogen and carbon atoms. The thickness of the $SiO_x$ layer is generally less than the thickness of the protective coating layer, and is preferably not less than about 0.01 micron, more preferably not less than about 0.02 micron, and most preferably not less than about 0.05 micron, and preferably not more than about 5 microns, more preferably not more than about 2 microns, and most preferably not more than about 1 micron.

It may be desirable to coat the adhesion promoter layer with alternating layers of the protective coating layer and the $SiO_x$ layer. The ratio of the thicknesses of the protective coating layers and the $SiO_x$ layers are preferably not less than about 1:1, more preferably not less than about 2:1, and preferably not greater than about 10:1, more preferably not greater than about 5:1.

The organosilicon polymer coatings are prepared from an organosilicon compound such as a silane, siloxane, or a silazane. Examples of silanes include dimethoxydimethylsilane, methyltrimethoxysilane, tetramethoxysilane, methyltriethoxysilane, diethoxydimethylsilane, methyltriethoxysilane, triethoxyvinylsilane, tetraethoxysilane, dimethoxymethylphenylsilane, phenyltrimethoxysilane, 3-glycidoxypropyltrimethoxysilane, 3-methacryloxypropyltrimethoxysilane, diethoxymethylphenylsilane, tris(2-methoxyethoxy) vinylsilane, phenyltriethoxysilane, and dimethoxydiphenylsilane. Examples of siloxanes include tetramethyldisiloxane (TMDSO) and hexamethyldisiloxane. Examples of silazanes include hexamethylsilazane and tetramethylsilazane.

The organosilicon polymer coatings are preferably applied by a plasma enhanced chemical vapor deposition (PECVD) technique as disclosed in U.S. Pat. No. 5,298,587, which disclosure is incorporated herein by reference.

In one aspect of the present invention, the laminate is optically clear and comprises a substrate having a stress optic coefficient (SOC) in the range of from about −2000 to about +2500 Brewsters and a $T_g$, as determined by differential scanning calorimetry, preferably in the range of from about 160° C. to about 270° C. Preferably, the SOC of the substrate is not less than about −1000, more preferably not less than about −500, and most preferably not less than about −100, and not greater than about 1000, more preferably not greater than about 500, and most preferably not greater than about 100 Brewsters. The $T_g$ of the substrate is preferably not less than about 180° C., more preferably not less than about 190° C., and most preferably not less than about 200° C., to not greater than about 250° C., more preferably not greater than about 240° C., and most preferably not greater than about 230° C. The term "optically clear" is used herein to mean that the substrate has a measured total light transmission value according to ASTM D-1003 of at least about 80 percent, preferably at least about 85 percent.

For liquid crystal display applications, the substrate preferably comprises a carbonate polymer which can be a homopolymer or a copolymer or a blend having the desired SOC and $T_g$. Preferably, the substrate comprises a carbonate polymer which is the reaction product of an aromatic polyol, more preferably an aromatic diol, with a carbonate precursor. Representative examples of aromatic diols include catechol, hydroquinone, dihydroxynaphthalenes, dihydroxyanthracenes, bis(hydroxyaryl) fluorenes, dihydroxyphenanthrenes, dihydroxybiphenyls, and bis (hydroxyphenyl) propanes. Preferred aromatic diols include 9,9-bis(4-hydroxyphenyl)fluorene and bisphenol A.

Carbonate precursors suitable for use in preparing these carbonate polymers are well known in the art and include carbonic acid derivatives, phosgene, haloformates, or carbonate esters such as dimethyl carbonate or diphenyl carbonate. The carbonate polymers can be prepared by a variety of polymerization processes including interfacial, solution, or melt processes, all of which are well known in the art.

Preferably, the substrate comprises a carbonate polymer that contains repeat units of a dihydroxyarylfluorene monomer and a bisphenol monomer, more preferably 9,9'-dihydroxyarylfluorene and bisphenol A. The ratio of units of the 9,9'-dihydroxyarylfluorene and bisphenol A is preferably not less than about 30:70, more preferably not less than about 40:60, and preferably not greater than about 90:10, more preferably not greater than about 70:30.

FIG. 1 shows a graphical depiction of the variance of SOC and $T_g$ of a number copolycarbonates of 9,9-bishydroxyphenylfluorene (BHPF) and bisphenol A (BPA). The graph indicates that copolycarbonates in the range of about 30:70 to 90:10 mol percent BHPF/BPA have SOCs and $T_g$s that are especially suitable for liquid crystal display device applications. The optimal SOC (SOC equals 0) occurs with a BHPF/BPA ratio of about 70:30, whereas the optimal $T_g$ occurs at a somewhat lower ratio. Fortunately, adjustment of $T_g$ can be made without substantial change to the SOC, for example, by incorporating ester units into the carbonate polymer to make a carbonate/ester copolymer, or by blending polyesters and/or carbonate/ester copolymers with the carbonate polymer. This concentration of ester units incorporated into the carbonate polymer, or the amount of polyesters and/or carbonate/ester copolymers blended with the carbonate polymer, is sufficient to achieve the desired $T_g$ without substantial diminution of other physical properties.

Preferably, the ester units are the reaction product of aliphatic or aromatic diacid or diacid chloride or mixtures thereof. The aliphatic diacid or diacid chloride is preferably a $C_{3-12}$ diacid or di(acid chloride), more preferably a $C_{4-8}$ diacid or di(acid chloride), and most preferably adipic acid, adipoyl chloride, succinic acid, or succinyl chloride. The aromatic diacid is preferably terephthalic acid, terephthaloyl chloride, isophthalic acid, isophthaloyl chloride, 2,6- naphthalene dicarboxylic acid, or 2,6-naphthalene diacid chloride. Preferably, the concentration of ester units in the substrate is in the range of from about 10 to about 50 mol percent, based on the total moles of carbonate units and ester units.

The following examples are for illustrative purposes only and are not intended to limit the scope of this invention. All percentages are w/w unless otherwise noted.

EXAMPLE 1

Preparation of a $SiO_xC_yH_z$-Coated Carbonate Polymer

A. Preparation of a 60:40 Mole Ratio BHPF/BPA Copolycarbonate

A copolycarbonate of 60 mole percent 9,9-bis(4-hydroxyphenyl) fluorene (BHPF) and 40 mole percent bisphenol A (BPA) is prepared as follows. To a 100 mL high pressure reactor with plug are added BPA (0.913 g, 4.0 mmole), BHPF (2.102 g, 6.0 mmole), t-butylphenol (0.045 g, 0.30 mmole), aqueous 50 percent NaOH solution (2.0 g, 25.0 mmole), and water (16.14 g). The reactor is purged with nitrogen. Nitrogen gas is blown through the air space of the reactor for 10 minutes, then the plug is tightened down. The sealed reactor is placed in a water bath (69° C. to 71° C.) and the solution is stirred. After the monomer is dissolved, phosgene solution in methylene chloride (20.08 g of 6.65 percent solution, 13 mmole) is added to the stirred mixture using a 25-mL gas-tight syringe. The syringe is removed and the reaction mixture is shaken for 30 seconds. A second addition of 50 percent NaOH (2.0 g, 25 mmole) is added by syringe through the septum.

The mixture is shaken for 1 minute, whereupon additional methylene chloride (11.17 g) is added by syringe followed by 4-dimethylamino pyridine (0.6 mL of a 1 percent aqueous solution). This mixture is shaken for 1 minute, whereupon the reactor is swirled in an ice bath. The reactor is opened, and the aqueous phase pipetted off. The organic phase is washed once with 1 N HCl and twice with water, and then removed by evaporation. The resultant copolycarbonate has a $T_g$ of 230° C. (PC-230). This general procedure is used to prepare additional quantities of copolycarbonate, which are injection molded into 127-×127-×1.6-mm plaques.

B. Preparation of a BHPF/BPA Copolycarbonate Blend

BHPF/BPA copolycarbonate blend having a $T_g$ of 190° C. (PC-190) is prepared by dry-blending the copolycarbonate prepared in the manner described in Part A (56 parts by weight) with bisphenol A polycarbonate (44 parts by weight). The resulting mixture is extrusion compounded and pelletized using a 30-mm Werner-Pfleiderer extruder with the feed zone set at 200° C. and the four remaining zones set at 310° C.

C. Deposition of the PECVD coating on the Carbonate Polymer Substrates

The deposition of the highly crosslinked organosilicon coating (generally of the formula $SiO_xC_yH_z$) is carried out in a PECVD stainless steel box equipped with a shower head planar magnetron cathode as shown in FIGS. 1, 2, and 3 in U.S. Pat. No. 5,320,875. A plaque from Part A or B (PC-230 or PC-190 respectively) is placed 3.2 cm above the cathode around the center of the cathode. The plaque is first coated with a 1000 to 1500- Å thick adhesion layer of plasma polymerized TMDSO. TMDSO (4 sccm) is fed into the chamber through the shower head cathode. The gas inlet holes of the shower head are evenly distributed on the plasma ring of the magnetron cathode. This configuration of gas inlet maximizes the decomposition probability of tetramethyldisiloxane by allowing the molecules to flow through the most intense plasma region. The TMDSO vapor flow is controlled by a Model 1152 MKS Inc. vapor flow controller and the plasma power is supplied by an ENI power supply (Model PlasmaLoc 2). The power loaded to the plasma during deposition of the adhesion promoter is 500 watts (W) at 40 Khz corresponding to a power density of $6.3 \times 10^8$ J/kg. The chamber base pressure is less than 1 mTorr. The process pressure is approximately 27 mTorr.

The highly crosslinked organosilicon coating is deposited onto the adhesion layer by feeding into the chamber a mixture of 40 sccm $O_2$ (flow rate controlled by Model 1160 MKS gas flow controllers) and 4 sccm TMDSO. The power loaded to the plasma during deposition is 40 W at 40 Khz, corresponding to a power density of $2.9 \times 10^7$ J/kg.

Resistance of the coated plaques to N-methylpyrrolidinone (NMP) is determined by adding a drop of NMP to the coated surface and allowing the drop to stand for five minutes before rinsing it off with water. Visual observation of an absence of clouding shows a resistance to NMP. For PC-230, coatings of 1.0-, 1.2-, 1.4-, and 1.6-micron thickness impart solvent resistance. For PC-190, coatings of 1.2-, 1.4-, and 1.6-micron thickness impart solvent resistance.

EXAMPLE 2

Preparation of a $SiO_xC_yH_z/SiO_x$-Coated Carbonate Polymer

A plaque (either PC-190 or PC-230) with a layer of adhesion promoter as prepared in Example 1 is coated alternately with $SiO_x$ and organosilicon coatings. The $SiO_x$ coatings each have a thickness of 0.072 micron and the highly crosslinked organosilicon coatings each have a thickness of 0.262 micron. The first $SiO_x$ coating is applied to the plaque by feeding into the chamber a mixture of 40 sccm $O_2$ (flow rate controlled by Model 1160 MKS gas flow controllers) and 4 sccm TMDSO. The power loaded to the plasma during deposition is 250 W at 40 Khz, corresponding to a power density of $1.8 \times 10^8$ J/kg. Then, the first organosilicon coating is applied using the conditions described in Example 1. The second $SiO_x$ coating is applied, followed by a second organosilicon coating, then a third $SiO_x$ coating, and finally a third organosilicon coating. The total thickness of the coatings is 1.0 micron. Both PC-190 and PC-230 samples are resistant to NMP with this alternate coating technique.

What is claimed is:

1. A laminate which comprises:
   a) a plastic substrate having a surface;
   b) an adhesion promoter layer which is a first plasma polymerized organosilicon compound deposited on the surface of the substrate at a power level in the range of about $5 \times 10^7$ J/kg to about $5 \times 10^9$ J/kg, and in the substantial absence of oxygen; and
   c) a protective coating layer which is a second plasma polymerized organosilicon compound deposited on the surface of the adhesion layer at a power density from about $10^6$ J/kg to about $10^8$ J/kg, and in the presence of a higher level of oxygen than used in step (b).

2. The laminate of claim 1 which further comprises an $SiO_x$ layer which is a plasma polymerized third organosilicon compound deposited on the surface of the layer of the protective coating layer, in the presence of a stoichiometric excess of oxygen, and at a power density of at least about twice the power density used to form the protective coating layer.

3. The laminate of claim 2 which further comprises alternating layers of the protective coating layer and the $SiO_x$ layer.

4. The laminate of claim 2 wherein the first, the second, and the third organosilicon polymers that are plasma polymerized are each independently selected from the group consisting of dimethoxydimethylsilane, methyltrimethoxysilane, tetramethoxysilane, methyltriethoxysilane, diethoxydimethylsilane, methyltriethoxysilane, triethoxyvinylsilane, tetraethoxysilane, dimethoxymethylphenylsilane, phenyltrimethoxysilane, 3-glycidoxypropyltrimethoxysilane, 3-methacryloxypropyltrimethoxysilane, diethoxymethylphenylsilane, tris(2-methoxyethoxy) vinylsilane, phenyltriethoxysilane, dimethoxydiphenylsilane, tetramethyldisiloxane, hexamethyldisiloxane, hexamethylsilazane, and tetramethylsilazane.

5. The laminate of claim 4 wherein the first, the second, and the third organosilicon polymers that are plasma polymerized are tetramethyldisiloxane.

6. The laminate of claim 2 wherein the substrate is a carbonate polymer which comprises repeat units of a reaction product of a carbonate precursor with an aromatic diol.

7. The laminate of claim 6 wherein the aromatic diol comprises resorcinol, catechol, hydroquinone, a dihydroxynaphthalene, a dihydroxyanthracene, a bis (hydroxyaryl) fluorene, a dihydroxyphenanthrene, a dihydroxybiphenyl, or a bis(hydroxyphenyl) propane.

8. The laminate of claim 7 wherein the carbonate polymer comprises repeat units of 9,9-bis(4-hydroxyphenyl)fluorene and bisphenol A.

9. The laminate of claim 8 wherein the ratio of the repeat units of 9,9-bis(4-hydroxyphenyl)fluorene and bisphenol A is from about 40:60 to about 70:30.

10. The laminate of claim 1 wherein the $T_g$ of the substrate is in the range of from about 180° C. to about 240° C., and the SOC of the laminate is in the range of from about −1000 to about 1000 Brewsters, which laminate is optically clear.

11. A laminate which comprises:

a) a plastic substrate having a surface and a thickness of not less than about 0.1 mm and not more than about 10 mm;

b) an adhesion promoter layer which is a plasma polymerized tetramethyldisiloxane deposited on the surface of the substrate at a power level in the range of about $5\times10^7$ J/kg to about $5\times10^9$ J/kg and in the substantial absence of oxygen, which adhesion promoter has a thickness of not less than about 1000 Å and not more than 2000 Å;

c) a protective coating layer which is a plasma polymerized tetramethyldisiloxane deposited on the surface of the adhesion promoter layer at a power density from about $10^6$ J/kg to about $10^8$ J/kg in the presence of a sufficient stoichiometric excess of oxygen with respect to tetramethyldisiloxane to form an organosilicon compound having the formula $SiO_{1.8-2.4}$ $C_{0.3-1.0}$ and $H_{0.7-4.0}$ that contains trapped water and at least one of the following functional groups: —Si—O—Si—, —Si—CH$_2$—, —Si—H, or —Si—OH;

wherein the thickness of the protective coating layer is not less than about 0.1 micron and not greater than about 2 microns; and d) an $SiO_x$ layer which is a layer of a plasma polymerized tetramethyldisiloxane deposited on the surface of the protective coating layer, in the presence of a stoichiometric excess of oxygen, and at a power density of at least four times the power density used to form the protective coating layer, wherein the $SiO_x$ layer has a thickness of not less than about 0.05 micron and not more than about 1 micron.

12. A laminate which comprises:

a) a plastic substrate having a surface; and b) an adhesion promoter layer which is a plasma polymerized organosilicon compound deposited on the surface of the substrate at a power level in the range of about $5\times10^7$ J/kg to about $5\times10^9$ J/kg, and in the substantial absence of oxygen.

* * * * *